(12) United States Patent
Ito et al.

(10) Patent No.: US 10,564,547 B2
(45) Date of Patent: Feb. 18, 2020

(54) PATTERN FORMED BODY

(71) Applicant: DEXERIALS CORPORATION, Shinagawa-ku, Tokyo (JP)

(72) Inventors: Makiya Ito, Tokyo (JP); Ryosuke Endo, Tokyo (JP); Kyungsung Yun, Tokyo (JP); Hirofumi Kondo, Tokyo (JP)

(73) Assignee: DEXERIALS CORPORATION, Shinagawa-Ku, Tokyo (JP)

( * ) Notice: Subject to any disclaimer, the term of this patent is extended or adjusted under 35 U.S.C. 154(b) by 134 days.

(21) Appl. No.: 15/102,362

(22) PCT Filed: Oct. 30, 2014

(86) PCT No.: PCT/JP2014/078846
§ 371 (c)(1),
(2) Date: Jun. 7, 2016

(87) PCT Pub. No.: WO2015/087634
PCT Pub. Date: Jun. 18, 2015

(65) Prior Publication Data
US 2017/0261857 A1 Sep. 14, 2017

(30) Foreign Application Priority Data
Dec. 10, 2013 (JP) .................................. 2013-254705

(51) Int. Cl.
*G03F 7/20* (2006.01)
*G03F 7/09* (2006.01)
(Continued)

(52) U.S. Cl.
CPC .............. *G03F 7/2016* (2013.01); *G03F 7/09* (2013.01)

(58) Field of Classification Search
CPC combination set(s) only.
See application file for complete search history.

(56) References Cited

U.S. PATENT DOCUMENTS 5,312,716 A * 5/1994 Unoki ....................... G03F 7/09
257/642
5,470,617 A 11/1995 Nishii et al.
(Continued)

FOREIGN PATENT DOCUMENTS

EP  3009264 A1  4/2016
GB  2432044 A   5/2007
(Continued)

OTHER PUBLICATIONS

Extended Search Report issued by the European Patent Office in corresponding European Patent Application No. 14868981.3 dated Jul. 26, 2017 (9 pages).
(Continued)

*Primary Examiner* — David Sample
*Assistant Examiner* — Nicole T Gugliotta
(74) *Attorney, Agent, or Firm* — Buchanan, Ingersoll & Rooney PC (57) ABSTRACT

A pattern formed body, including a cured resin layer 12 having a low surface free energy region a and a high surface free energy region b on a base 11, in which a difference in surface free energy between the low surface free energy region a and the high surface free energy region b is greater than 6 mJ/m$^2$, and the low surface free energy region a and the high surface free energy region b are optically leveled surfaces. Accordingly, an ink is applied on the pattern formed body to easily color code.

10 Claims, 9 Drawing Sheets

(51) Int. Cl.
  *G03F 7/00* (2006.01)
  *G03F 7/004* (2006.01)
  *G03F 7/027* (2006.01)
  *G03F 7/075* (2006.01)
  *B41C 1/10* (2006.01)
  *B41N 1/14* (2006.01)

(56) References Cited

U.S. PATENT DOCUMENTS

| | | | |
|---|---|---|---|
| 2006/0159849 A1* | 7/2006 | Morita | B82Y 10/00 427/258 |
| 2007/0105396 A1 | 5/2007 | Li et al. | |
| 2009/0265929 A1* | 10/2009 | Nakagawa | H01L 21/67144 29/846 |
| 2010/0316849 A1 | 12/2010 | Millward et al. | |
| 2012/0038712 A1 | 2/2012 | Akiyama et al. | |
| 2016/0124305 A1 | 5/2016 | Ito et al. | |

FOREIGN PATENT DOCUMENTS

| | | | | |
|---|---|---|---|---|
| JP | 60-226534 A | 11/1985 | | |
| JP | 60-245643 A | 12/1985 | | |
| JP | 07-207049 A | 8/1995 | | |
| JP | 2003-211861 A | 7/2003 | | |
| JP | 2003-240916 A | 8/2003 | | |
| JP | 2005-52686 A | 3/2005 | | |
| JP | 2007-69177 A | 3/2007 | | |
| JP | 2009-071037 A | * | 4/2009 | H05K 3/00 |

OTHER PUBLICATIONS

International Search Report (PCT/ISA/210) dated Jan. 27, 2015, by the Japanese Patent Office as the International Searching Authority for International Application No. PCT/JP2014/078846.

Written Opinion (PCT/ISA/237) dated Jan. 27, 2015, by the Japanese Patent Office as the International Searching Authority for International Application No. PCT/JP2014/078846.

International Preliminary Examination Report (PCT/IPEA/409) dated Dec. 8, 2015, by the Japanese Patent Office as the International Searching Authority for International Application No. PCT/JP2014/078846.

* cited by examiner

PATTERN FORMED BODY

TECHNICAL FIELD

The present invention relates to a pattern formed body having a pattern formed with a difference in surface free energy.

BACKGROUND ART

Currently, most of fine patterns for electronic circuits in semiconductor devices, displays, or electronic products are produced by photolithography, but there is a limit to produce inexpensive products with photolithography. In production of electronic products aiming to give a large area, it is difficult to reduce a production cost with a production method using lithography.

Considering the aforementioned trends, so-called "printed electronics," which produces electronic circuits, sensors, or elements utilizing printing techniques, has been studied. This method has attracted attentions as a production method, which can reduce a usage amount of chemical substances, and is friendly to the environment. Moreover, part of this method has already applied for electrode printing of a membrane keyboard, automobile windshield defogger, or RFID (Radio Frequency Identification) tag antenna.

In the printed electronics, it is important to control wettability of a base (a side where printing is performed on). The control of wettability can be achieved by controlling surface free energy, and various methods have been proposed. Among them, proposed is a base, which is patterned with a difference in surface free energy.

In the technology disclosed in PTL 1, for example, a surface is modified with radial rays applied through a mask, or generated ozone to thereby form a pattern with surface free energy difference. In the technology disclosed in PTL 2, moreover, a low surface free energy area is locally formed by exposure using a difference in light transmittance of Fresnel lens, and then a high surface free energy area is formed by exposing the unexposed area with light in water.

The base of PTL 1 has surface free energy difference formed thereon, but the surface free energy difference is small. In the case where an ink is applied onto the surface of the base, therefore, the ink cannot completely achieve color coding, and the ink merely forms difference in a thickness of the coated film.

The base of PTL 2 similarly has surface free energy difference formed thereon, but color coding cannot be achieved only by applying an ink onto the surface of the base. It is necessary to provide a step for removing the ink from the area where it is not desirable to deposit the ink (a low surface free energy area).

CITATION LIST

Patent Literature

PTL 1 Japanese Patent Application Laid-Open (JP-A) No. 2005-52686

PTL 2 JP-A No. 2003-240916

SUMMARY OF INVENTION

Technical Problem

The present invention aims to solve the aforementioned various problems in the art, and to achieve the following object. Specifically, an object of the present invention is to provide a pattern formed body, to which color coding with an ink can be achieved.

Solution to Problem

The means for solving the aforementioned problems are as follows.

<1> A pattern formed body, containing:

a pattern formed with a first region, and a second region having higher surface free energy than surface free energy of the first region, wherein a difference in the surface free energy between the first region and the second region is greater than 6 mJ/m$^2$, and wherein the first region and the second region are formed to be leveled.

<2> The pattern formed body according to <1>, wherein the difference in the surface free energy between the first region and the second region is 20 mJ/m$^2$ or greater.

<3> The pattern formed body according to <1> or <2>, wherein the pattern is formed in a cured product of a resin composition containing a fluororesin-based compound or a silicone resin-based compound, and wherein an amount of the fluororesin-based compound or the silicone resin-based compound aligned at a surface of the first region is greater than an amount thereof at a surface of the second region.

<4> The pattern formed body according to any one of <1> to <3>, wherein the resin composition is a radically-polymerizable resin composition.

<5> A production method of a pattern formed body, containing:

applying a resin composition onto a base, where the resin composition contains a first compound that exhibits low surface free energy, and a second compound that exhibits higher surface energy than the first compound;

bringing the resin composition into contact with a master, to which a pattern has been formed with a difference in surface free energy, followed by curing the resin composition to thereby form a cured resin layer, to which the pattern of the master is transferred, on the base; and peeling the cured resin layer from the master, to thereby obtain a pattern formed body, to which a pattern is formed with a first region, and a second region having higher surface free energy than the first region, where a difference in the surface free energy between the first region and the second region is greater than 6 mJ/m$^2$, and the first region and the second region are formed to be leveled.

<6> The production method of a pattern formed body according to <5>, wherein the difference in the surface free energy between the first region and the second region is 20 mJ/m$^2$ or greater.

<7> The production method of a pattern formed body according to <5> or <6>, wherein the pattern is formed with a cured product of a resin composition containing a fluororesin-based compound or a silicone resin-based compound, and wherein an amount of the fluororesin-based compound or the silicone resin-based compound aligned at a surface of the first region is greater than an amount thereof at a surface of the second region.

<8> The production method of a pattern formed body according to any one of <5> to <7>, wherein the resin composition is a radically-polymerizable resin composition.

<9> The production method of a pattern formed body according to any one of <5> to <8>, wherein a base of the master is glass.

<10> The production method of a pattern formed body according to any one of <5> to <9>, further containing applying an ink composition onto the cured resin layer, and curing the ink composition.

Advantageous Effects of the Invention

The present invention can solve the aforementioned various problems in the art, achieve the aforementioned object, and provide a pattern formed body, to which an ink is easily coated to color code, because surface free energy difference of a pattern is large, and has a leveled surface.

DESCRIPTION OF EMBODIMENTS

Embodiments of the present invention are specifically explained with reference to drawing in the following order.
1. Pattern Formed Body;
2. Production Method of Pattern Formed Body; and
3. Examples.

1. Pattern Formed Body

The pattern formed body according to one embodiment of the present invention contains a pattern formed with a first region, and a second region having higher surface free energy than surface free energy of the first region, wherein a difference in the surface free energy between the first region and the second region is greater than 6 mJ/m$^2$, and the first region and the second region are formed to be leveled. Accordingly, color-coding with an ink can be performed excellently on the pattern formed body.

Figure 1:
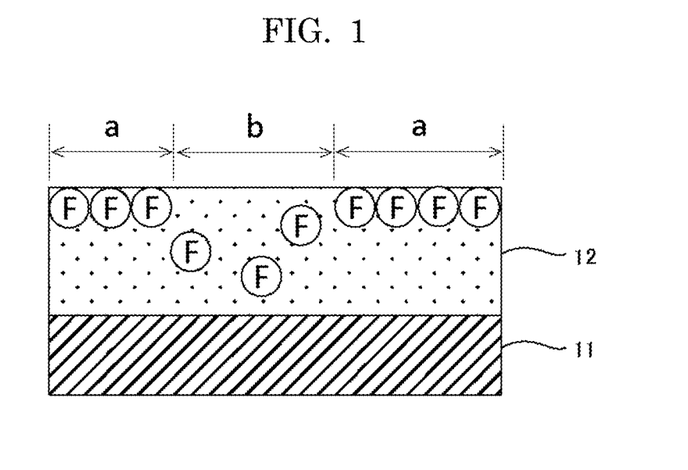
FIG. 1 is a cross-sectional view illustrating one example of a pattern formed body.

FIG. 1 is a cross-sectional view illustrating one example of the pattern formed body. The pattern formed body contains a base 11, and a cured resin layer 12, which is disposed on the base 11, and has a pattern formed with a low surface free energy region a and a high surface free energy region b.

The base 11 is not particularly limited, and polyethylene terephthalate (PET), glass, or polyimide can be used as the base. Moreover, a transparent material or an opaque material can be used as the base 11. In the case where the cured resin layer 12 is formed of, for example, a UV-curable resin composition, UV-ray irradiation can be performed from the side of the base 11 by using a transparent material that transmits UV rays as the base 11.

The cured resin layer 12 is a cured product of a resin composition containing a first compound exhibiting low surface free energy, and a second compound exhibiting surface free energy higher than the surface free energy of the first compound. The cured resin layer 12 has a low surface free energy region a and a high surface free energy region b at a surface thereof.

The difference in the surface free energy between the low surface free energy region a and the high surface free energy region b is greater than 6 mJ/m$^2$, preferably 20 mJ/m$^2$ or greater. For example, the low surface free energy region a is an area where an amount of the fluororesin-based compound or the silicone resin-based compound aligned at a surface thereof is larger than an amount thereof in the high surface free energy region b.

Moreover, the low surface free energy region a and the high surface free energy region b are optically leveled surfaces, and a gap in height between the low surface free energy region a and the high surface free energy region b is preferably less than several tens nanometers.

As for the first compound, a surface adjusting agent, such as so-called "an anti-blocking agent," "a slipping agent," "a leveling agent," and "an antifouling agent." The first compound is preferably a fluororesin-based compound, or a silicone resin-based compound. Examples of the fluororesin-based compound include a perfluoropolyether group-containing compound, and a perfluoroalkyl group-containing compound. Examples of the silicone resin-based compound include a polydimethylsiloxane-containing compound, and a polyalkylsiloxane-containing compound.

The second compound is not limited, as long as the second compound is a compound exhibiting surface free energy higher than the surface free energy of the first compound. In the case where a perfluoroalkyl group-containing acrylate is used as the first compound, for example, hydroxyl group-containing acrylate (e.g., pentaerythritol triacrylate, and polyethylene glycol monoacrylate) is preferably used as the second compound.

As for the resin composition, a fast curing radically-polymerizable resin composition, or cationic polymerizable resin composition is preferably used. Other than the first compound and the second compound, the resin composition contains a polymerizable resin, and a polymerization initiator.

The radically-polymerizable resin composition contains acrylate, and a radical polymerization initiator. Examples of the acrylate include pentaerythritol triacrylate, propylene glycol-modified glycerin triacrylate, ethylene glycol diacrylate, diethylene glycol diacrylate, and trimethylol propane triacrylate. These may be used alone, or in combination. Moreover, examples of the radical polymerization initiator include an alkylphenone-based photopolymerization initiator, an acylphosphine oxide-based photopolymerization initiator, and a titanocene-based photopolymerization initiator. These may be used alone, or in combination.

The cationic polymerizable resin composition contains an epoxy resin, and a cationic polymerization initiator. Examples of the epoxy resin include a bisphenol epoxy resin, a phenol novolak epoxy resin, an alicyclic epoxy resin, a heterocyclic epoxy resin, and a glycidyl ester epoxy resin. These may be used alone, or in combination. Examples of the cationic polymerization initiator include onium salts, such as an aromatic sulfonium salt, an aromatic diazenium, an iodonium salt, a phosphonium salt, and a selenonium salt. These may be used alone, or in combination.

Note that, as other compounds, the resin composition may contain a viscosity modifier, and a diluent, if necessary.

The pattern formed body according to the present embodiment has large difference in surface free energy of a pattern, and has a leveled surface. Therefore, an ink can be easily applied to color code thereon. Accordingly, a processing pattern having a fine pitch and excellent size stability can be obtained by processing the leveled pattern surface with an ink composition. Moreover, the pattern formed body can be applied in the electronics field, such as electronic circuit patterns, or the biomedical field, such as DNA chips.

2. Production Method of Pattern Formed Body

The production method of a pattern formed body according to one embodiment of the present invention contains: applying a resin composition onto a base, where the resin composition contains a first compound that exhibits low surface free energy, and a second compound that exhibits higher surface energy than the first compound; bringing the resin composition into contact with a master, to which a pattern has been formed with a difference in surface free energy, followed by curing the resin composition to thereby form a cured resin layer, to which the pattern of the master is transferred, on the base; and peeling the cured resin layer from the master, to thereby obtain a pattern formed body, to which a pattern is formed with a first region, and a second region having higher surface free energy than the first region, where a difference in the surface free energy between the first region and the second region is greater than 6 mJ/m$^2$, and the first region and the second region are formed to be leveled.

Each step is explained with reference to FIGS. 2 and 3, hereinafter. Note that, a fluororesin-based compound is taken as an example of a first compound in FIGS. 2 and 3, but the first compound is not limited to the fluororesin-based compound.

Figure 2:
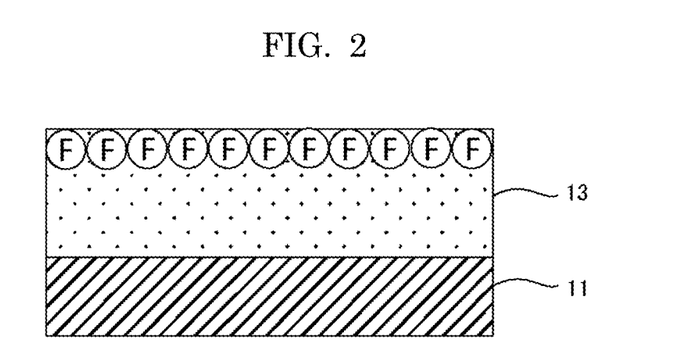
FIG. 2 is a cross-sectional view illustrating an outline of a coating step.

FIG. 2 is a cross-sectional view illustrating an outline of a coating step. In the coating step, a resin composition 13 is applied onto a base 11. As for the coating, a bar coater, a spray coater, or a spin coater can be used.

The base 11 is not particularly limited, and polyethylene terephthalate (PET), glass, or polyimide can be used as the base. Moreover, a transparent material or an opaque material is used as the base. In the case where a UV-curable resin composition is used as the resin composition 13, UV-ray irradiation can be performed from the side of the base 11 by using a transparent material that transmits UV rays as the base 11.

Similarly to the aforementioned cured resin layer 12, the resin composition 13 contains a first compound exhibiting low surface free energy, and a second compound exhibiting surface free energy higher than the surface free energy of the first compound.

Figure 3:
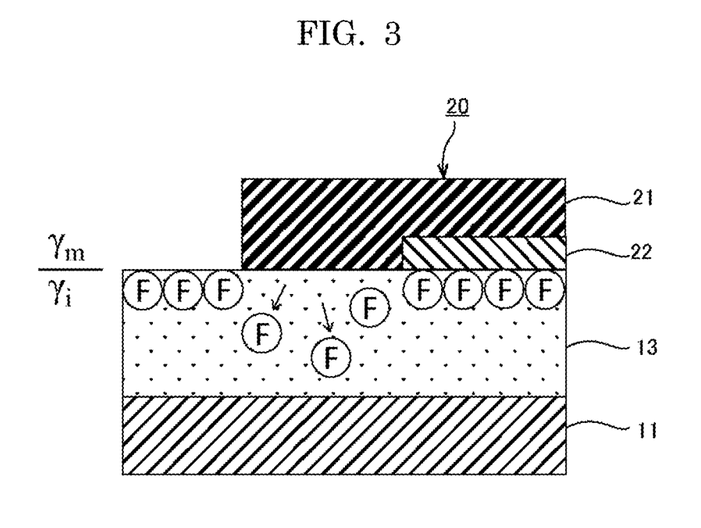
FIG. 3 is a cross-sectional view illustrating an outline of a curing step.

FIG. 3 is a cross-sectional view illustrating an outline of a curing step. In this curing step, the resin composition 13 is cured with bringing into contact with a master 20 to which a pattern is formed with difference in surface free energy, to thereby form a cured resin layer to which a pattern of the master 20 has been transferred, on the base 11.

The master 20 contains a higher surface free energy region 21 and a low surface free energy region 22 at the surface thereof. For example, the high surface free energy region 21 is a region of glass, metal, or silicon, and the low surface free energy region 22 is a region of a fluorine coating, or a silicone coating.

The base of the master 20 is preferably glass to which fluorine coating is easily performed. Moreover, the surface of the master 20 is preferably leveled.

In the case where the master 20 is brought into contact with the resin composition 13, as illustrated in FIG. 3, the state of the interface between the master 20 and the resin composition 13 is that the first compound at the surface of the resin composition 13 moves to the low surface free energy region 22 of the master 20, and the second compound moves to the high surface free energy region 22, as Δγ specified by the following formula (1) tries to be small.

$$\Delta\gamma = \gamma_m - \gamma_i \quad (1)$$

In the formula (1) above, $\gamma_m$ is surface free energy of the surface of the master 20, and $\gamma_i$ is surface free energy of the surface of the resin composition 12.

Accordingly, for example, the fluororesin-based compound moves to the low surface free energy region 22, such as a fluorine coating region, and is removed from an interface of the high surface free energy region 21, as illustrated in FIG. 3. Then, the resin composition 13 is cured in the state where the master 20 is in contact with the resin composition 13, to thereby form a cured resin layer 12, to which the pattern of the master 20 has been transferred, on the base 11. The curing method of the resin composition 13 is appropriately selected depending on a type of the resin for use. For example, energy line (e.g., heat, and ultraviolet rays) irradiation can be used.

Moreover, the production method preferably further includes, after the curing step, applying an ink composition onto the cured resin layer, and curing the ink composition. As for the ink composition, for example, a composition, which has the same formulation to that of the resin composition 13, with proviso that the first compound is removed, can be used.

As described above, a pattern with the difference in the surface free energy of the master 20 can be repeatedly transferred by using the master 20. Moreover, the transferred pattern with the difference in the surface free energy is excellent in terms of fine pitch, and size stability. Moreover, the cured coating film thereof has excellent transparency.

EXAMPLES

3. Examples

Examples of the present invention are explained in details, hereinafter. In Examples below, transfer was performed on a resin composition using each of Masters 1 to 5 having certain surface free energy over an entire surface, and surface free energy of a surface of a cured product of the resin composition was measured. Then, transfer was performed on a resin composition using Masters 6 to 9, which used Master E as a base, and had low surface free energy partially. Moreover, size stability of an ink composition was evaluated with varying a line width of a pattern. Note that, the present invention is not limited to Examples.

As for the exposure devices, contact angle gauge, microscope, FE-SEM, and atomic force microscope (AFM), the following devices were used.
Exposure Device 1: Mask Aligner MA-20 (manufactured by MIKASA CO., LTD.)
Exposure Device 2: Alignment exposure device (manufactured by Toshiba Lighting & Technology Corporation)
Contact Angle Gauge: DM-701 (manufactured by Kyowa Interface Science Co., Ltd.)
Microscope: VHX-1000 (manufactured by Keyence Corporation)
SEM: S-4700 (manufactured by Hitachi High-Technologies Corporation)
AFM: SPA400 (manufactured by Hitachi High-Tech Science Corporation)
[Evaluation of Surface Free Energy]
Surface free energy of a master, and surface free energy of a resin composition for transferring after being cured were calculated by means of the contact angle gauge in accordance with the Kaelbl-Wu method.
[Resin Composition for Transferring]
A formulation (part[s] by mass) of the resin composition for transferring is depicted in Table 1.

TABLE 1

|  | Ink |
| --- | --- |
| TMM-3 | 80 |
| OTA-480 | 15 |
| AE-400 | 5 |
| KY-1203 | 1 |
| IRGACURE 184 | 3 |

In Table 1, each component was as follows.
TMM-3: pentaerythritol triacrylate, manufactured by Shin-Nakamura Chemical Co., Ltd.
OTA-480: propylene glycol-modified glycerin triacrylate, manufactured by DAICEL-ALLNEX LTD.
AE-400: polyethylene ethylene glycol monoacrylate #400, manufactured by NOF Corporation
KY-1203: perfluoropolyether-containing acrylate, manufactured by Shin-Etsu Chemical Co., Ltd.
IRGACURE 184: manufactured by BASF
[Preparation and Transfer of Master 1]
A glass slide in the size of 7 cm×5 cm was washed with a cleaning fluid (product name: Novec7300, manufactured by 3M Company). Thereafter, the glass slide was coated with a fluorine coating agent (product name: DURASURF DS-5200, manufactured by HARVES Co., Ltd.) by dripping. After leaving to stand overnight, the resultant was washed with a cleaning fluid (product name: Novec7300, manufactured by 3M Company). Thereafter, the resultant was coated with a fluorine coating agent (product name: DURASURF DS-5200, manufactured by HARVES Co., Ltd.) by dripping. After leaving to stand overnight, the resultant was washed with a cleaning fluid (product name: Novec7300, manufactured by 3M Company), to thereby obtain Master 1 (an entire surface of which was coated with fluorine). As depicted in Table 2, the surface free energy of Master 1 was 13.2 mJ/m$^2$.

The resin composition for transferring was applied onto a PET film (product name: Lumirror U-48, manufactured by TORAY INDUSTRIES, INC.) having a thickness of 100 μm by a bar coater (wet film thickness: 8 μm equivalent). The applied resin composition was brought into contact with Master 1, and was then cured by exposure performed by Exposure Device 2 from a surface of the PET. The radiation dose of the exposure was 6 J/cm$^2$. The film was peeled from Master 1 to thereby obtain a cured resin layer, to which the surface free energy of Master 1 had been transferred, on the PET film. As depicted in Table 2, the surface free energy of the cured resin layer was 16.7 mJ/m$^2$.
[Preparation and Transfer of Master 2]
Master 2 was prepared in the same manner as Master 1, provided that a 0.15% trimethoxy(1H,1H,2H,2H-heptadecafluorodecyOsilane (manufactured by SYNQUEST LABS, INC.) Novec7200 (manufactured by 3M Company) solution was used as the fluorine-coating agent. As depicted in Table 2, the surface free energy of Master 2 was 14.0 mJ/m$^2$. Moreover, a cured resin layer, to which the surface free energy of Master 2 had been transferred, was obtained in the same manner as Master 1. The surface free energy of the cured resin layer was 19.4 mJ/m$^2$.
[Preparation and Transfer of Master 3]
Master 3 was prepared in the same manner as Master 1, provided that a 0.15% trimethoxy(1H,1H,2H,2H-nanofluorohexyl)silane (manufactured by Tokyo Chemical Industry Co., Ltd.) Novec7200 (manufactured by 3M Company) solution was used as the fluorine-coating agent. As depicted in Table 2, the surface free energy of Master 3 was 24.3 mJ/m$^2$. Moreover, a cured resin layer, to which the surface free energy of Master 3 had been transferred, was obtained in the same manner as Master 1. The surface free energy of the cured resin layer was 26.5 mJ/m$^2$.
[Preparation and Transfer of Master 4]
Master 4 was prepared in the same manner as Master 1, provided that a 0.15% trimethoxy(1H,1H,2H,2H-heptafluoropentyl)silane (manufactured by Tokyo Chemical Industry Co., Ltd.) Novec7200 (manufactured by 3M Company) solution was used as the fluorine-coating agent. As depicted in Table 2, the surface free energy of Master 4 was 38.2 mJ/m$^2$. Moreover, a cured resin layer, to which the surface free energy of Master 4 had been transferred, was obtained in the same manner as Master 1. The surface free energy of the cured resin layer was 45.3 mJ/m$^2$.
[Preparation and Transfer of Master 5]
A glass slide washed in the same manner as in the preparation of Master 1 without using a fluorine coating agent was provided as Master 5. As depicted in Table 2, the surface free energy of Master 5 was 200 mJ/m$^2$ to 400 mJ/m$^2$. Moreover, a cured resin layer, to which the surface free energy of Master 5 had been transferred, was obtained in the same manner as Master 1. The surface free energy of the cured resin layer was 51.3 mJ/m$^2$.

TABLE 2

| | Surface free energy of master (mJ/m$^2$) | Surface free energy of cured resin layer (mJ/m$^2$) |
|---|---|---|
| Master 1 | 13.2 | 16.7 |
| Master 2 | 14.0 | 19.4 |
| Master 3 | 24.3 | 26.5 |
| Master 4 | 38.2 | 45.3 |
| Master 5 | 200-400*) | 51.3 |

*)NEW GLASS, Vol. 21, No. 3, 2006, p 27.

Example 1

In Example 1, a patterned master using Master 5 as a substrate was prepared, and the pattern was transferred to a cured resin layer. Color coding with an ink using the surface free energy difference Δ of the pattern was evaluated.

[Preparation and Transfer of Master 6]

A negative photoresist (product name: OFPR-800LB, manufactured by Tokyo Ohka Kogyo Co., Ltd.) was applied onto a glass substrate in the size of 10 cm×10 cm by spin coating, and the applied photoresist was dried for 90 seconds at 110° C. on a hot plate. The substrate coated with the photoresist, and a photomask, to which lines and spaces of 5 μm had been patterned, were set, and subjected to exposure by means of Exposure Device 1. After the exposure, the substrate was immersed in a 2.38% tetramethyl ammonium hydroxide aqueous solution for 1 minute, and then was immersed in pure water for 1 minute, followed by drying at room temperature, to thereby perform developing.

The developed substrate was washed with pure water, and then with a cleaning fluid (product name: Novec7300, manufactured by 3M Company) in this order. Thereafter, a fluorine coating agent (product name: DURASURF DS-5200, manufactured by HARCES Co., Ltd.) was applied onto the substrate by dropwise. After leaving to stand overnight, the resultant was washed with a cleaning fluid (product name: Novec7300, manufactured by 3M Company). Thereafter, a fluorine coating agent (product name: DURASURF DS-5200, manufactured by HARCES Co., Ltd.) was applied thereon dropwise. The resultant was further left to stand overnight, and then washed with a cleaning fluid (product name: Novec7300, manufactured by 3M Company), followed by drying at room temperature.

Figure 4:
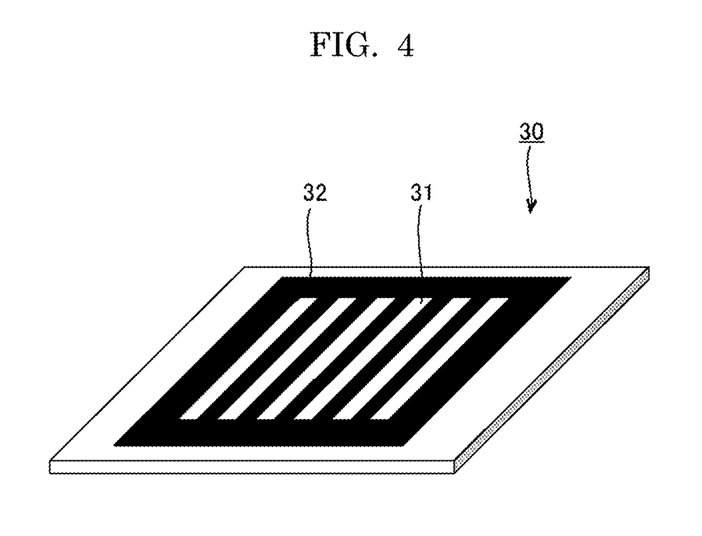
FIG. 4 is a perspective view illustrating an outline of Master 6 in Examples.

The resulting substrate was immersed in a stripping solution for 5 minutes to remove the remaining resist film, and then washed with acetone, and with a cleaning fluid (product name: Novec7300, manufactured by 3M Company) in this order. As a result, Master 6, in which the high surface free energy region 31 and the low surface free energy region 32 had been patterned (partially fluorine coated) on the glass substrate 30, as illustrated in FIG. 4, was obtained. The line width of the high surface free energy region 31 and the line width of the low surface free energy region 32 were both 5 μm (referred to as 5 μm-L&S).

Figure 5:
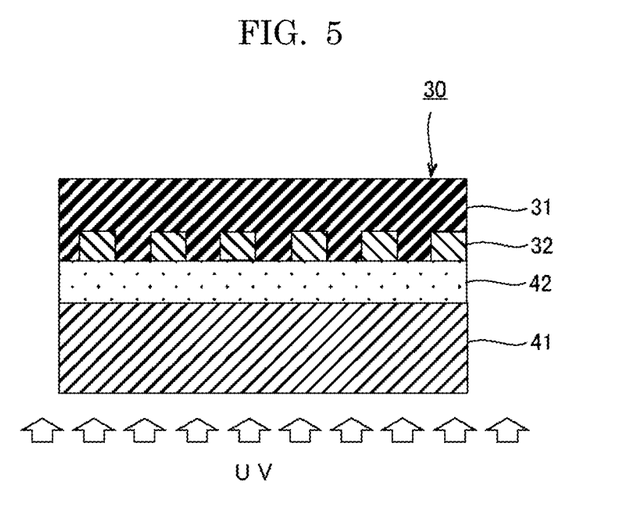
FIG. 5 is a cross-sectional view illustrating an outline of a curing step for curing a resin composition for transferring a pattern using Master 6.

FIG. 5 is a cross-sectional view illustrating an outline of a curing step where a resin composition for transferring is cured using a patterned master. As illustrated in FIG. 5, a resin composition 42 for transferring was applied onto a PET film 41 by means of a bar coater (wet film thickness: 8 μm equivalent). The applied resin composition was brought into contact with Master 30, and was then cured by exposure performed by Exposure Device B from a surface of the PET. The radiation dose of the exposure was 6 J/cm$^2$. The film was peeled from Master 30 for patterning, to thereby obtain a cured resin layer, to which the surface free energy of Master 6 had been transferred, on the PET film 41.

As depicted in Table 3, the surface free energy difference of the surface of the cured resin layer, to which the pattern of Master 6 had been transferred, as considered as 34.6 mJ/m$^2$ based on a difference between the surface free energy of the cured resin layer, to which the pattern of Master 5 had been transferred, and the surface free energy of the cured resin layer, to which the pattern of Master 1 had been transferred.

Figure 6:
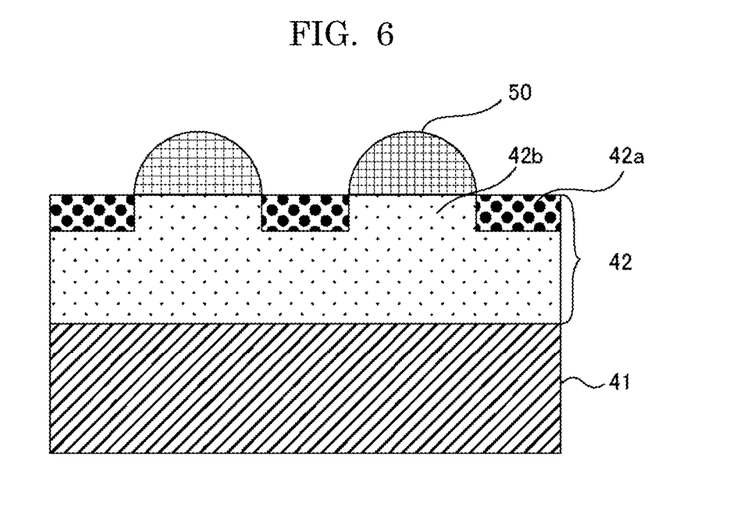
FIG. 6 is a cross-sectional view schematically illustrating a coated state of an ink on a surface of a cured resin layer.

As illustrated in FIG. 6, the surface of the cured resin layer was painted with an oil-based ink pen. Then, the deposition state of the ink was observed under a microscope. In the cured resin layer 42, an area 42a where an amount of fluorine-containing molecules aligned at a surface thereof is large, and an area 42b where an amount of the fluorine-containing molecules aligned at the surface thereof is small are formed. The ink 50 was selectively deposited on the areas 42b where the amount of the fluorine-containing molecules is small. As for the oil-based ink pen, a commercially available pen, "Mackee" manufactured by ZEBRA CO., LTD. was used.

Figure 7:
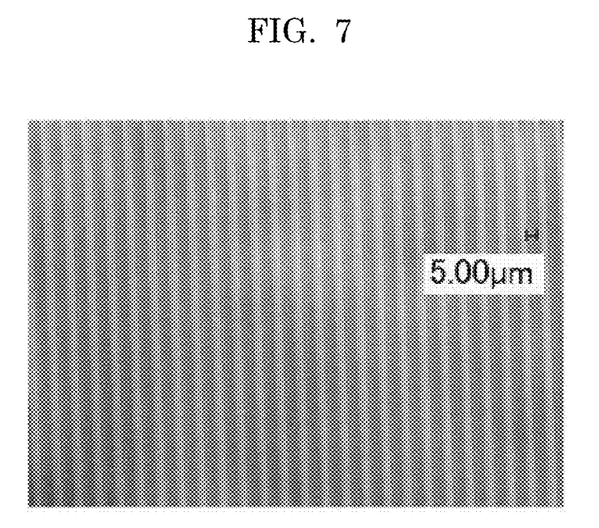
FIG. 7 is an optical microscopic picture depicting a coated state of an ink on a surface of a cured resin layer to which a pattern of Master 6 has been transferred.

FIG. 7 is an optical microscopic picture depicting a coated state of an ink on a surface of the cured resin layer, to which the pattern of Master 6 has been transferred. Since the surface free energy difference of the pattern was large, the ink was excellently applied to color code the 5 μm-L&S.

[Preparation and Transfer of Master 7]

Master 7, which was patterned with a 5 μm-L&S pattern, was prepared in the same manner as Master 6, provided that a 0.15% trimethoxy(1H,1H,2H,2H-heptadecafluorodecy-Osilane (manufactured by SYNQUEST LABS, INC.) Novec7200 (manufactured by 3M Company) solution was used as the fluorine coating agent.

Subsequently, a cured resin layer, to which the pattern of Master 7 had been transferred, was obtained in the same manner as Master 6. As depicted in Table 3, the surface free energy difference of the surface of the cured resin layer, to which the pattern of Master 7 had been transferred, as considered as 31.9 mJ/m$^2$ based on a difference between the surface free energy of the cured resin layer, to which the pattern of Master 5 had been transferred, and the surface free energy of the cured resin layer, to which the pattern of Master 2 had been transferred.

Figure 8:
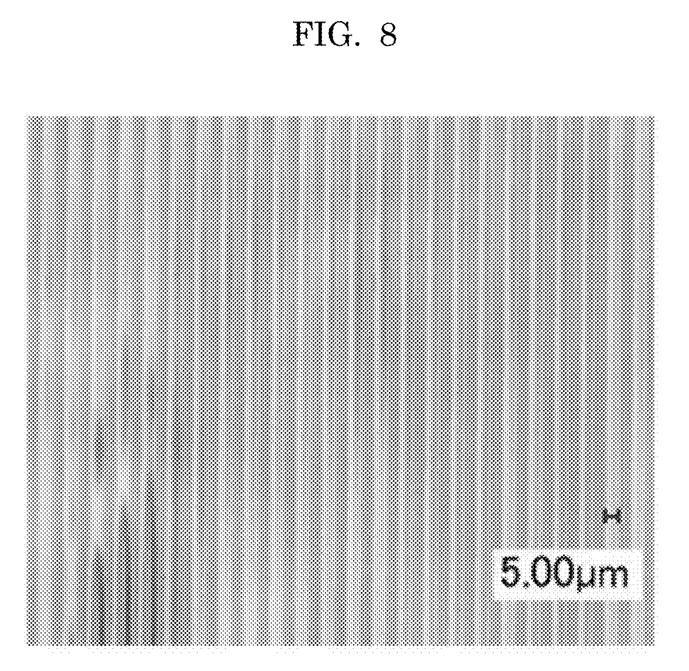
FIG. 8 is an optical microscopic picture depicting a coated state of an ink on a surface of a cured resin layer to which a pattern of Master 7 has been transferred.

FIG. 8 is an optical microscopic picture depicting a coated state of an ink on a surface of the cured resin layer, to which the pattern of Master 7 has been transferred. The surface of the cured resin layer was painted with an oil-based ink pen in the same manner as Master 6. As a result, the ink was excellently applied to color code the 5 μm-line & space, because the surface free energy difference of the pattern was large.

[Preparation and Transfer of Master 8]

Master 8, which was patterned with a 5 μm-L&S pattern, was prepared in the same manner as Master 6, provided that a 0.15% trimethoxy(1H,1H,2H,2H-nonafluorohexyl)silane (manufactured by Tokyo Chemical Industry Co., Ltd.) Novec7200 (manufactured by 3M Company) solution was used as the fluorine coating agent.

Subsequently, a cured resin layer, to which the pattern of Master 8 had been transferred, was obtained in the same manner as Master 6. As depicted in Table 3, the surface free energy difference of the surface of the cured resin layer, to which the pattern of Master 8 had been transferred, as considered as 24.8 mJ/m$^2$ based on a difference between the surface free energy of the cured resin layer, to which the pattern of Master 5 had been transferred, and the surface free energy of the cured resin layer, to which the pattern of Master 3 had been transferred.

Figure 9:
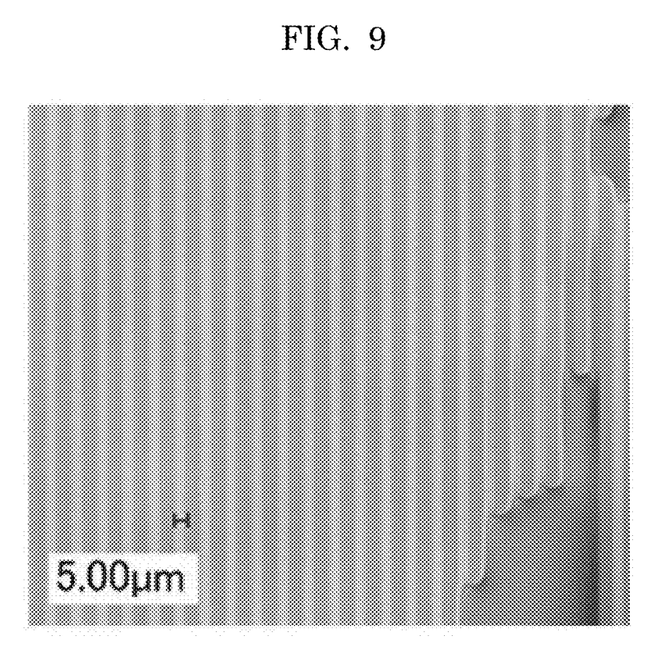
FIG. 9 is an optical microscopic picture depicting a coated state of an ink on a surface of a cured resin layer to which a pattern of Master 8 has been transferred.

FIG. 9 is an optical microscopic picture depicting a coated state of an ink on a surface of the cured resin layer, to which the pattern of Master 8 has been transferred. The surface of the cured resin layer was painted with an oil-based ink pen in the same manner as Master 6. As a result, the ink was applied to color code the 5 μm-L&S, although there were defects at part.

[Preparation and Transfer of Master 9]

Master 9, which was patterned with a 5 μm-L&S pattern, was prepared in the same manner as Master 6, provided that a 0.15% trimethoxy(1H,1H,2H,2H-heptafluoropentyl)silane (manufactured by Tokyo Chemical Industry Co., Ltd.) Novec7200 (manufactured by 3M Company) solution was used as the fluorine coating agent.

Subsequently, a cured resin layer, to which the pattern of Master 9 had been transferred, was obtained in the same manner as Master 6. As depicted in Table 3, the surface free energy difference of the surface of the cured resin layer, to which the pattern of Master 9 had been transferred, as considered as 6.0 mJ/m² based on a difference between the surface free energy of the cured resin layer, to which the pattern of Master 5 had been transferred, and the surface free energy of the cured resin layer, to which the pattern of Master 4 had been transferred.

Figure 10:
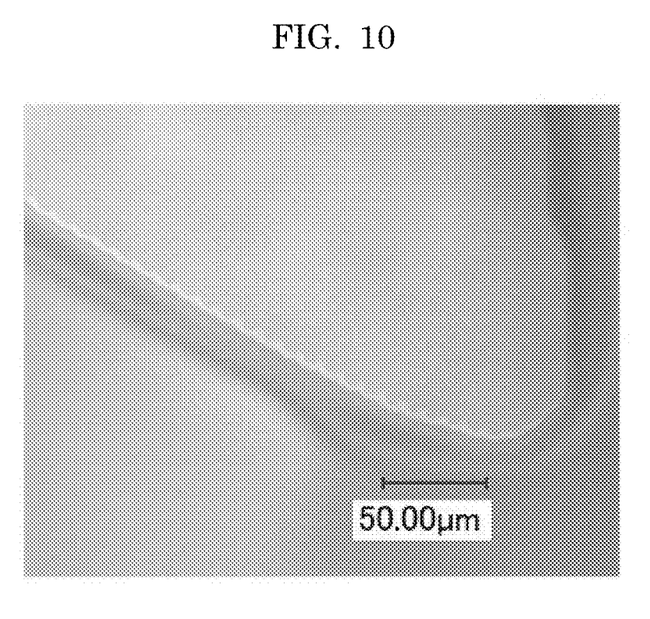
FIG. 10 is an optical microscopic picture depicting a coated state of an ink on a surface of a cured resin layer to which a pattern of Master 9 has been transferred.
Figure 11:
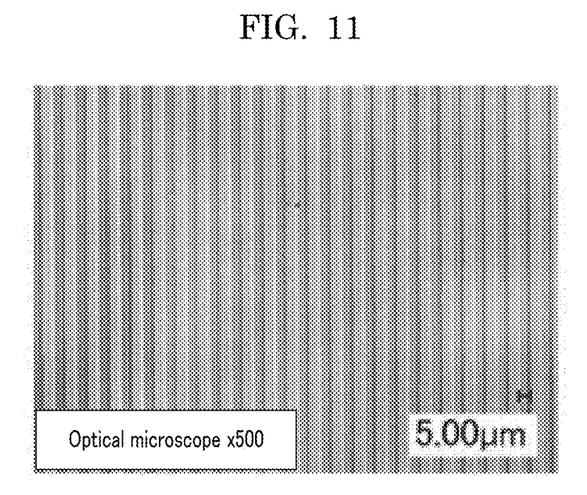
FIG. 11 is a surface observation image of a 5 μm-L&S ink pattern under an optical microscope.
Figure 12:
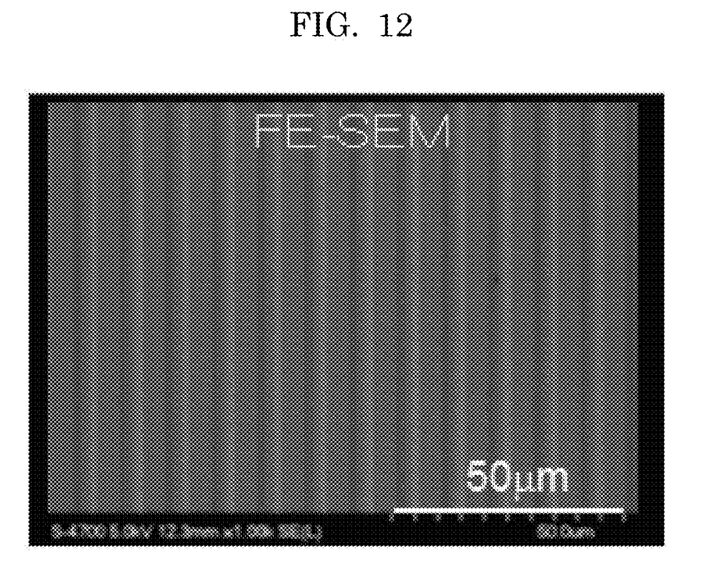
FIG. 12 is a surface observation image of a 5 μm-L&S ink pattern under an FE-SEM.
Figure 13:
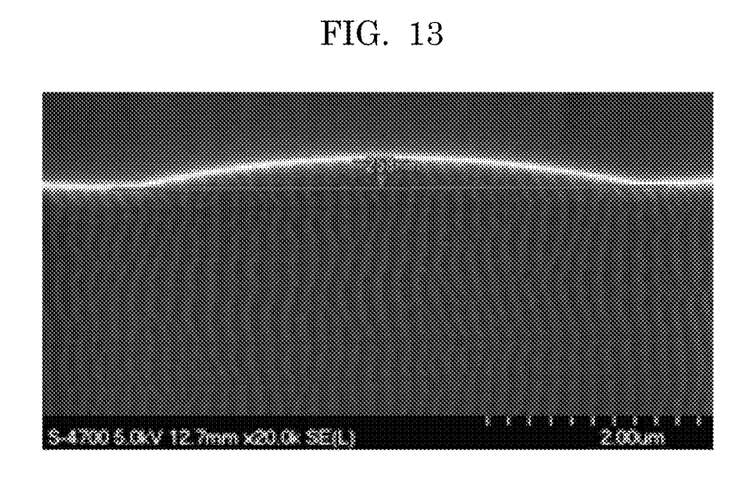
FIG. 13 is a cross-section observation image of a 5 μm-L&S ink pattern under an FE-SEM.
Figure 14:
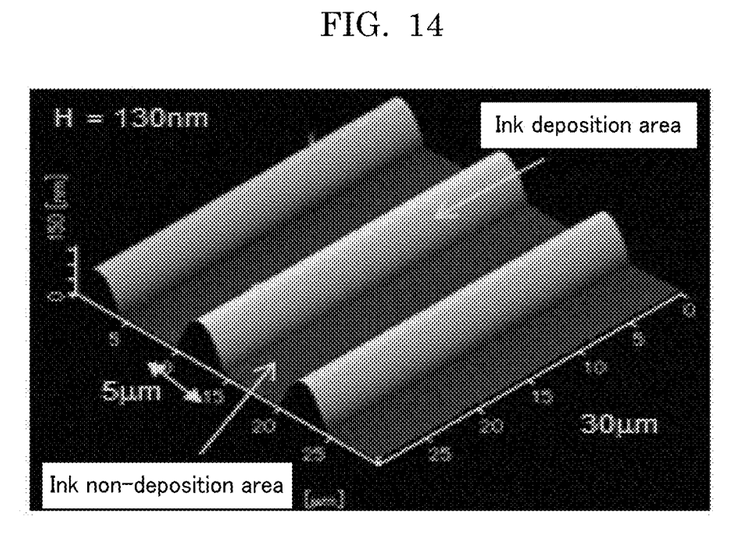
FIG. 14 is an observation image of a 5 μm-L&S ink pattern under an AFM.
Figure 15:
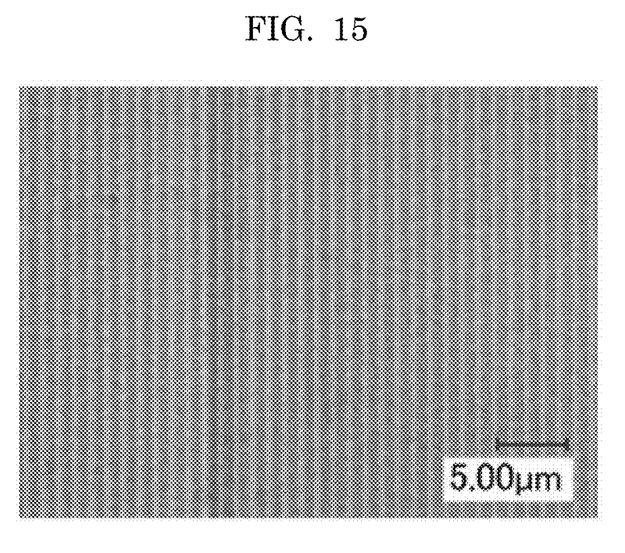
FIG. 15 is a surface observation image of a 0.5 μm-L&S ink pattern under an optical microscope.
Figure 16:
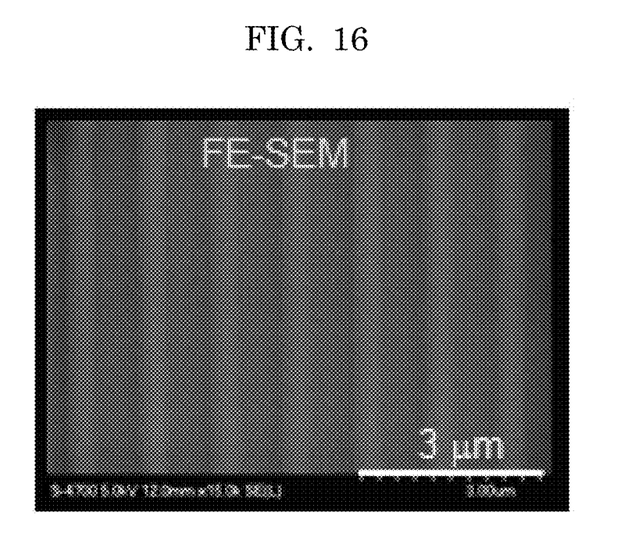
FIG. 16 is a surface observation image of a 0.5 μm-L&S ink pattern under an FE-SEM.
Figure 17:
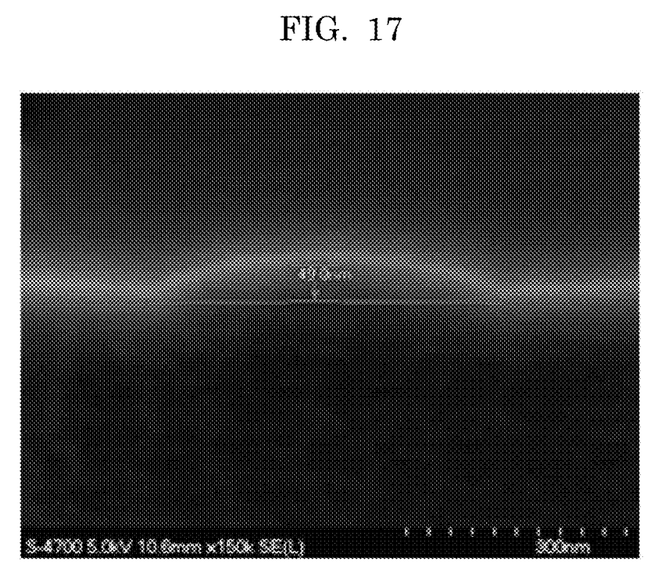
FIG. 17 is a cross-section observation image of a 0.5 μm-L&S ink pattern under an FE-SEM.
Figure 18:
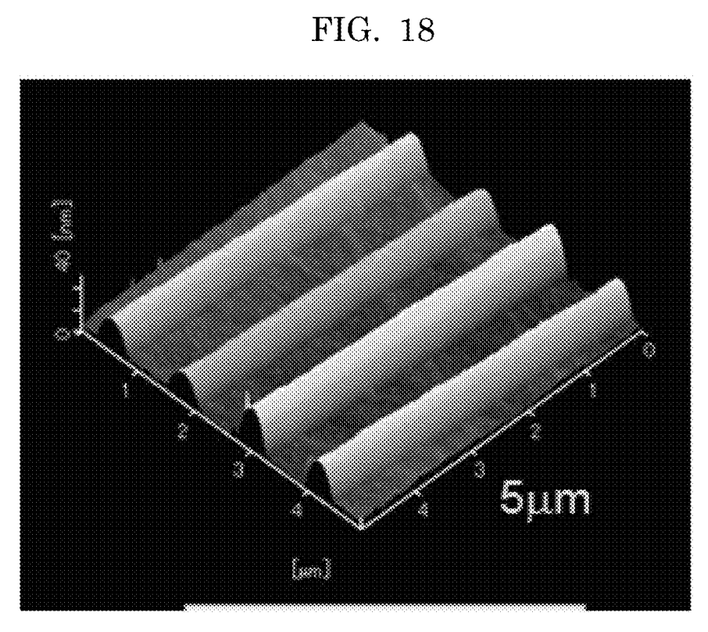
FIG. 18 is an observation image of a 0.5 μm-L&S ink pattern under an AFM.

FIG. 10 is an optical microscopic picture depicting a coated state of an ink on a surface of the cured resin layer, to which the pattern of Master 9 has been transferred. The surface of the cured resin layer was painted with an oil-based ink pen in the same manner as Master 6. As a result, the ink was applied to only partially color code the 5 μm-L&S.

TABLE 3

| | Surface free energy difference of cured resin layer pattern (mJ/m²) | Evaluation of color-coding with ink |
|---|---|---|
| Master 6 | 34.6 | Excellent color-coding |
| Master 7 | 31.9 | Excellent color-coding |
| Master 8 | 24.8 | Excellent color-coding in most of the area |
| Master 9 | 6.0 | Excellent color-coding at part |

It was found from the results depicted in Table 3 that the surface free energy difference Δ is preferably greater than 6.0 mJ/m², more preferably 24.8 mJ/m² or greater, in order to apply the ink to color-code Example 2

In Example 2, an ink was applied onto a cured resin layer having a 5 μm-L&S pattern, and a cured resin layer having a 0.5 μm-L&S pattern. The surfaces thereof were observed under a microscope, an FE-SEM, and an AFM.

The formulation (parts by mass) of the ink is depicted in Table 4. Note that, the ink was an ink identical to the resin composition for transferring, provided that perfluoropolyether-containing acrylate (KY-1203, manufactured by Shin-Etsu Chemical Co., Ltd.) was removed.

TABLE 4

| | Ink |
|---|---|
| TMM-3 | 80 |
| OTA-480 | 15 |
| AE-400 | 5 |
| IRGACURE 184 | 3 |

In Table 4, each component was as follows.
TMM-3: pentaerythritol triacrylate, manufactured by Shin-Nakamura Chemical Co., Ltd.
OTA-480: propylene glycol-modified glycerin triacrylate, manufactured by DAICEL-ALLNEX LTD.
AE-400: polyethylene ethylene glycol monoacrylate #400, manufactured by NOF Corporation,
IRGACURE 184: manufactured by BASF

[Preparation of 5 μm-L&S Ink Pattern]

A resin composition for transferring was applied onto a PET film (product name: Lumirror U-48, manufactured by TORAY INDUSTRIES, INC.) having a thickness of 100 μm by a bar coater (wet film thickness: 8 μm equivalent). The applied resin composition was brought into contact with Master 6, and was then cured by exposure performed by Exposure Device 2 from a surface of the PET. The radiation dose of the exposure was 6 J/cm². The film was peeled from Master 6 to thereby obtain a cured resin layer, to which the pattern of the 5 μm-L&S surface free energy difference Δ of Master 6 had been transferred, on the PET film.

Subsequently, an ink was applied on the cured resin layer by a bar coater (wet film thickness: 1.5 μm equivalent), and was then cured by exposure performed from a surface of the PET in a nitrogen atmosphere by means of Exposure Device 2, to thereby obtain a 5 μm-L&S ink pattern. The radiation dose of the exposure was 1.5 J/cm².

FIGS. 11 to 14 are a surface observation image of the 5 μm-L&S ink pattern by an optical microscope, a surface observation image thereof by an FE-SEM, a cross-section observation image thereof by an FE-SEM, and an observation image by an AFM, respectively. It was found from these observation images that the ink deposited areas and the ink non-deposition areas were observed with line widths of 5 μm as in Master 6, the ink could be selectively applied even when the ink was applied over the entire surface, and the pattern having excellent size stability could be obtained.

[Preparation of 0.5 μm-L&S Ink Pattern]

Master 10 having a 0.5 μm-L&S pattern was prepared in the same manner as Master 6, provided that the exposure method was changed to two-beam interference exposure. Then, a 0.5 μm-L&S ink pattern was prepared in the same manner as the 5 μm-L&S ink pattern.

FIGS. 15 to 18 are a surface observation image of the 0.5 μm-L&S ink pattern by an optical microscope, a surface observation image thereof by an FE-SEM, a cross-section observation image thereof by an FE-SEM, and an observation image by an AFM, respectively. It was found from these observation images that the ink deposited areas and the ink non-deposition areas were observed with line widths of 0.5 μm as in Master 10, the ink could be selectively applied even when the ink was applied over the entire surface, and the pattern having excellent size stability could be obtained.

As described above, the pattern of the master is transferred by curing the resin composition containing the first compound exhibiting low surface free energy, and the second compound exhibiting surface free energy higher than the surface free energy of the first compound, in contact with the master to which a pattern has been formed with difference in surface free energy, and a base film having a pattern of surface free energy, which have fine pitches, and excellent size stability, can be attained.

Moreover, a deposition and non-deposition of a coated product can be selectively formed using a pattern of surface free energy difference formed on a film, only by applying an ink, such as a resin composition, on a base film, and it is not necessary to remove the ink on the non-deposition area. Moreover, the pattern formed with the surface free energy difference can be formed in the size of submicron, and therefore it is excellent in reproducibility from a master, and size stability.

REFERENCE SIGNS LIST

11: base
12: cured resin layer
13: resin composition
20: master
21: high surface free energy region
22: low surface free energy region
30: glass substrate
31: high surface free energy region
32: low surface free energy region
41: PET film
42: resin composition
42a: area where there is a large amount of fluorine-containing molecules
42b: area where there is a small amount of fluorine-containing molecules
50: ink

The invention claimed is:

1. A pattern formed body, comprising:
a pattern formed with a first region, and a second region having higher surface free energy than surface free energy of the first region,
wherein the first region and the second region are formed to be leveled,
wherein the pattern is formed in a cured product of a resin composition containing at least one compound selected from the group consisting of a fluororesin-based compound and a silicone resin-based compound,
wherein an amount of the compound aligned at a surface of the first region is greater than an amount thereof at a surface of the second region resulting in a difference in the surface free energy between the first region and the second region greater than 6 mJ/m$^2$,
wherein the compound is also present in an inner region of the pattern formed body spaced from the surface of the second region, and
wherein both of the first region and the second region contain the compound.

2. The pattern formed body according to claim 1, wherein the difference in the surface free energy between the first region and the second region is 20 mJ/m$^2$ or greater.

3. The pattern formed body according to claim 1, wherein the resin composition is a radically-polymerizable resin composition.

4. A production method of a pattern formed body, comprising:
applying a resin composition onto a base, where the resin composition contains a first compound that exhibits low surface free energy and is at least one compound selected from the group consisting of a fluororesin-based compound and a silicone resin-based compound, and a second compound that exhibits higher surface energy than the first compound;
bringing the resin composition into contact with a master, to which a pattern has been formed with a difference in free surface energy, followed by curing the resin composition to thereby form a cured resin layer, to which the pattern of the master is transferred, on the base; and
peeling the cured resin layer from the master, to thereby obtain a pattern formed body, to which a pattern is formed with a first region, and a second region having higher surface free energy than the first region, wherein an amount of the first compound aligned at a surface of the first region is greater than an amount thereof at a surface of the second region resulting in a difference in the surface free energy between the first region and the second region greater than 6 mJ/m$^2$, and the first region and the second region are formed to be leveled.

5. The production method of a pattern formed body according to claim 4, wherein the difference in the surface free energy between the first region and the second region is 20 mJ/m$^2$ or greater.

6. The production method of a pattern formed body according to claim 4, wherein the pattern is formed with a cured product of a resin composition containing a fluororesin-based compound or a silicone resin-based compound, and
wherein an amount of the fluororesin-based compound or the silicone resin-based compound aligned at a surface of the first region is greater than an amount thereof at a surface of the second region.

7. The production method of a pattern formed body according to claim 4, wherein the resin composition is a radically-polymerizable resin composition.

8. The production method of a pattern formed body according to claim 4, wherein a base of the master is glass.

9. The production method of a pattern formed body according to claim 4, further comprising applying an ink composition onto the cured resin layer, and curing the ink composition.

10. The pattern formed body according to claim 1, wherein the compound is a fluororesin-based compound.

* * * * *